US012568689B2

(12) United States Patent
Lu et al.

(10) Patent No.: US 12,568,689 B2
(45) Date of Patent: Mar. 3, 2026

(54) ARRAY SUBSTRATE FOR REDUCING WIDTH OF SIGNAL LINES, METHOD FOR MANUFACTURING THE SAME AND DISPLAY DEVICE

(71) Applicant: HKC CORPORATION LIMITED, Shenzhen (CN)

(72) Inventors: Zhaoyang Lu, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 221 days.

(21) Appl. No.: 18/145,299

(22) Filed: Dec. 22, 2022

(65) Prior Publication Data

US 2023/0369347 A1    Nov. 16, 2023

(30) Foreign Application Priority Data

May 11, 2022    (CN) .......................... 202210506623.0

(51) Int. Cl.
| | |
|---|---|
| *H10D 86/60* | (2025.01) |
| *G02F 1/1333* | (2006.01) |
| *G02F 1/1345* | (2006.01) |
| *G02F 1/1362* | (2006.01) |
| *G02F 1/1368* | (2006.01) |
(Continued)

(52) U.S. Cl.
CPC ......... *H10D 86/60* (2025.01); *G02F 1/13629* (2021.01); *H10D 86/021* (2025.01); *H10D 86/441* (2025.01); *G02F 1/133357* (2021.01); *G02F 1/13454* (2013.01); *G02F 1/136227* (2013.01); *G02F 1/136286* (2013.01); *G02F 1/1368* (2013.01)

(58) Field of Classification Search
CPC .......................... G02F 1/13629; G02F 1/13452
See application file for complete search history.

(56) References Cited

U.S. PATENT DOCUMENTS

| | | | | |
|---|---|---|---|---|
| 2003/0189542 | A1* | 10/2003 | Lee ...................... | G09G 3/3677 |
| | | | | 345/93 |
| 2008/0157364 | A1* | 7/2008 | Yang ................. | G02F 1/136286 |
| | | | | 257/E21.597 |

FOREIGN PATENT DOCUMENTS

| | | |
|---|---|---|
| CN | 102403320 A | 4/2012 |
| CN | 104698711 A | 6/2015 |
| CN | 113703235 A | 11/2021 |

OTHER PUBLICATIONS

First Office Action issued in counterpart Chinese Patent Application No. 202210506623.0, dated Jun. 21, 2022.

* cited by examiner

*Primary Examiner* — Lauren Nguyen
(74) *Attorney, Agent, or Firm* — Westbridge IP LLC

(57) ABSTRACT

Disclosed are an array substrate, a method for manufacturing an array substrate and a display device. The array substrate includes a display area, a gate driving circuit area and a signal line area. The display area is provided with a plurality of pixels. The gate driving circuit area is provided with a gate driving circuit for driving the pixels. The signal line area is provided with a plurality of signal lines for providing driving signals for the gate driving circuit. The signal line area includes a plurality of first metal layers and at least one second metal layer. The signal lines include a plurality of first signal lines and a plurality of second signal lines. The first signal lines are for accessing the driving signals and the second signal lines are for transmitting the driving signals to the gate driving circuit.

9 Claims, 5 Drawing Sheets

(51) Int. Cl.
H10D 86/01 (2025.01)
H10D 86/40 (2025.01)

ARRAY SUBSTRATE FOR REDUCING WIDTH OF SIGNAL LINES, METHOD FOR MANUFACTURING THE SAME AND DISPLAY DEVICE

CROSS-REFERENCE TO RELATED APPLICATIONS

This application claims priority to Chinese Patent Application No. 202210506623.0, filed on May 11, 2022, the entire contents of which are incorporated herein by reference.

TECHNICAL FIELD

The present disclosure relates to the technical field of display devices, in particular to an array substrate, a method for manufacturing an array substrate, a display panel and a display device.

BACKGROUND

As the display technology develops continuously, liquid crystal displays (LCDs) and organic light-emitting diode (OLED) displays are the mainstream displays on the market, because they have many advantages such as thin body, power saving, and no radiation, and are widely used. At present, most of the LCDs use gate driver less (GDL) technology, which replaces the external integrated circuit board by fabricating the gate driving circuit on the substrate, to reduce the cost. The GDL driver circuit is mainly composed of the GDL circuit area and the clock signal (CLK) lines. Since the signal lines require a certain width for layout, more lines greater width, resulting in that the frames on both sides of the display panel become wider and the narrow frame is designed more difficultly.

SUMMARY

The main objective of the present disclosure is to provide an array substrate, a method for manufacturing an array substrate, a display panel and a display device, which aims to solve the technical problem that the panel frame is wider in the prior art.

In order to achieve the above objective, the array substrate includes a display area, a gate driving circuit area and a signal line area. The display area is provided with a plurality of pixels. The gate driving circuit area is provided with a gate driving circuit for driving the pixels. The signal line area is provided with a plurality of signal lines for providing driving signals for the gate driving circuit.

The signal line area includes a plurality of first metal layers and at least one second metal layer. Two adjacent first metal layers are at least provided with one second metal layer therebetween. The signal lines include a plurality of first signal lines and a plurality of second signal lines. The first metal layer is provided with the first signal lines and the second metal layer is provided with the second signal lines. The first signal lines are connected to the second signal lines in an adjacent second metal layer and the second signal lines are connected to the gate driving circuit. The first signal lines are for accessing the driving signals and the second signal lines are for transmitting the driving signals to the gate driving circuit.

In some embodiments, the display area further includes a data line, a scan line and a thin film transistor (TFT). The data line is connected to a source electrode or a drain electrode of the TFT. The scan line is connected to a gate electrode of the TFT, and the drain electrode or the source electrode of the TFT is connected to a pixel electrode of each pixel.

In some embodiments, the gate driving circuit is for outputting a gate control voltage to turn on or turn off the TFT.

In some embodiments, the first signal lines are provided vertically and the second signal lines are provided horizontally.

In some embodiments, the signal line area further includes a base and a first insulating layer. One of the first metal layers and the first insulating layer are provided on the base, the first metal layer is covered by the first insulating layer, and the second metal layer is provided on the first insulating layer. The first insulating layer is defined with a first hole. First signal lines on the first metal layer on the base are connected to the second signal lines on the second metal layer.

In some embodiments, the signal line area further includes a passive layer and a second insulating layer. The second insulating layer is covered by the passive layer. Another of the first metal layers is provided on the passive layer, the second insulating layer is provided on the another of the first metal layers on the passive layer. The passive layer is defined with a second hole. The first signal lines on the another of the first metal layers on the passive layer are connected to the second signal lines on the second metal layer.

In some embodiments, the signal line area includes a clock signal line area and a common signal line area. The clock signal line area is provided at an inner side of the common signal line area. Each first signal line includes a clock signal line and a common signal line. The clock signal line is provided in the clock signal line area, and a projection of at least one clock signal line partially overlaps with a projection of the other clock signal lines in a vertical direction.

In some embodiments, at least one the clock signal line is configured to be partially into the gate driving circuit area.

In some embodiments, at least one the clock signal line is configured to be partially into the common signal line area.

In some embodiments, a clock signal line farthest from the gate driving circuit area is non-overlapping with other clock signal lines. A groove is provided in the clock signal area above the clock signal line farthest from the gate driving circuit area, and is for being filled with a sealant.

In order to achieve the above objective, the present disclosure further provides a method for manufacturing an array substrate. The method for manufacturing an array substrate includes:

providing a base;
    forming a patterned first metal layer on the base, the first metal layer includes first signal lines;
    forming a first insulating layer on the first metal layer, the first insulating layer is defined with a first hole;
    depositing a second metal layer on the first insulating layer, the second metal layer includes second signal lines and a gate driving circuit wiring connected to each other, and the second signal lines is connected to the first signal lines through the first hole;
    depositing a passive layer on the second metal layer, the passive layer is defined with a second hole;
    forming a third metal layer on the passive layer, the third metal layer comprises third signal lines connected to the second signal lines through the second hole;

the first signal lines and the third signal lines are for accessing driving signals, and the second signal lines is for transmitting the driving signals to the gate driving circuit wiring.

In some embodiments, the number of the second signal lines is equal to a sum of the third signal lines and the first signal lines.

In some embodiments, a planarization layer is provided on the third metal layer.

In some embodiments, a hole is defined on the planarization layer in a display area to deposit a pixel electrode in the hole.

In order to achieve the above objective, the present disclosure further provides a display panel. The display panel includes a color filter and an array substrate aforementioned. The color filter is configured to be aligned with the array substrate.

In order to achieve the above objective, the present disclosure further provides a display device. The display device includes a backlight module and a display panel aforementioned. The backlight module and the display panel are configured corresponding to each other, and the backlight module is for providing a backlight source for the display panel.

The array substrate in the present disclosure includes a display area, a gate driving circuit area and a signal line area. The signal lines include a plurality of first signal lines and a plurality of second signal lines. The first metal layer is provided with the first signal lines and the second metal layer is provided with the second signal lines. The first signal lines are connected to the second signal lines in an adjacent second metal layer and the second signal lines are connected to the gate driving circuit. In the present disclosure, since the signal lines overlap in space, the horizontal width of the signal lines can be reduced, to reduce the width of the frame of the panel.

BRIEF DESCRIPTION OF THE DRAWINGS

In order to more clearly illustrate the technical solutions in the embodiments of the present disclosure or in the related art, drawings in the embodiments or in the related art will be briefly described below. Obviously, the drawings in the following description are only some embodiments of the present disclosure. Other drawings can be obtained by those skilled in the art according to the structures shown in the drawings without creative work.

Figure 1:
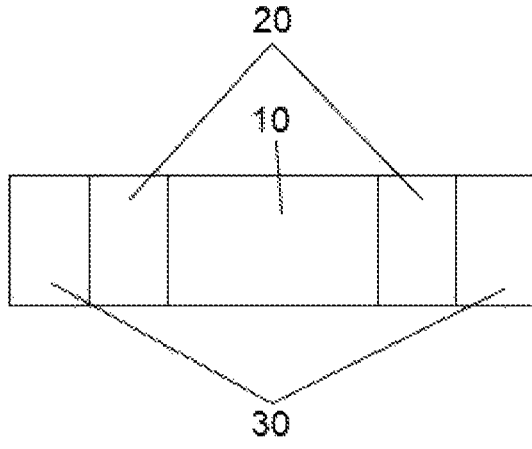
FIG. 1 is a schematic structural view of an array substrate according to some embodiments of the present disclosure.

The realization of the objective, functional characteristics, and advantages of the present disclosure are further described with reference to the accompanying drawings.

DETAILED DESCRIPTION OF THE EMBODIMENTS

It should be understood that the specific embodiments of the present disclosure described herein are only used to explain the disclosure, and do not limit the scope of the present disclosure.

The technical solutions of embodiments of the present disclosure will be clearly and completely described with reference to the drawings of the present disclosure. Obviously, the described embodiments are only some rather than all of the embodiments of the present disclosure. Based on the embodiments of the present application, all other embodiments obtained by those skilled in the art without creative efforts shall fall within the scope of the present disclosure.

It should be noted that all directional indicators (such as up, down, left, right, front, rear, etc.) in the embodiments of the present disclosure are only used to explain the relative positional relationship, movement situation, etc. among components in a specific attitude (as shown in the drawings). If the specific attitude changes, the directional indication also changes accordingly.

In addition, the descriptions related to "first", "second" and the like in the present disclosure are merely for descriptive purposes, and should not be understood as indicating or implying their relative importance or implicitly indicating the number of technical features indicated. Therefore, the features defined by "first" and "second" may explicitly or implicitly include at least one such feature. Besides, the various embodiments can be combined with each other, but the combination must be based on what can be achieved by those skilled in the art. When the combination of the embodiments is contradictory or cannot be achieved, it should be considered that such combination does not exist, or is not within the scope of the present disclosure.

As shown in FIG. 1, FIG. 1 is a schematic structural view of an array substrate 80 according to some embodiments of the present disclosure. The present disclosure provides an array substrate 80.

As shown in FIG. 1, in some embodiments, the array substrate 80 includes a display area 10, a gate driving circuit area 20 and a signal line area 30. The display area 10 is provided with a plurality of pixels. The gate driving circuit area 20 is provided with a gate driving circuit for driving the pixels. The signal line area 30 is provided with a plurality of signal lines for providing driving signals for the gate driving circuit.

It is understandable that the display area 10 further includes a data line, a scan line and a thin film transistor (TFT). The data line is connected to a source electrode or a drain electrode of the TFT. The scan line is connected to a gate electrode of the TFT, and the drain electrode or the source electrode of the TFT is connected to a pixel electrode 40 of each pixel. The data line is connected to the source driving circuit and the scan line is connected to the gate driving circuit. The gate driving circuit is for outputting a gate control voltage to turn on or turn off the TFT. In some embodiments, the gate driving circuit can be composed of a plurality of cascaded gate on array (GOA) circuits. The signal lines are used to provide the corresponding control signals for the GOA circuit. The signal lines can be the pulse signal (CK) lines, the voltage signal (VSS) lines, the reset signal lines or the frame start signal (STV) lines and other signal lines. The number of CK signal lines may be 4, 8, or 12 according to the different structures of the GOA circuit. For a 55-inch display panel 100, the width of the gate drive circuit (GDL) area can reach 2.4 mm, and the width of the CK signal line (8CK) can reach 1.4 mm. It can be seen that the number of signal lines is increased, a narrow frame is designed more difficultly.

It should be noted that in the array substrate 80 shown in FIG. 1, a gate driving circuit area 20 and a signal line area 30 are respectively provided on both sides of the display area 10. Since the array substrate 80 is larger, the array substrate 80 is often provided with gate driving circuits on both sides to ensure efficient driving of pixels. At present, for a smaller array substrate 80, the gate driving circuit may be provided only on one side thereof. That is, the gate driving circuit area 20 and the signal line area 30 may be provided only on one side of the display area 10, which is not limited herein.

Figure 2:
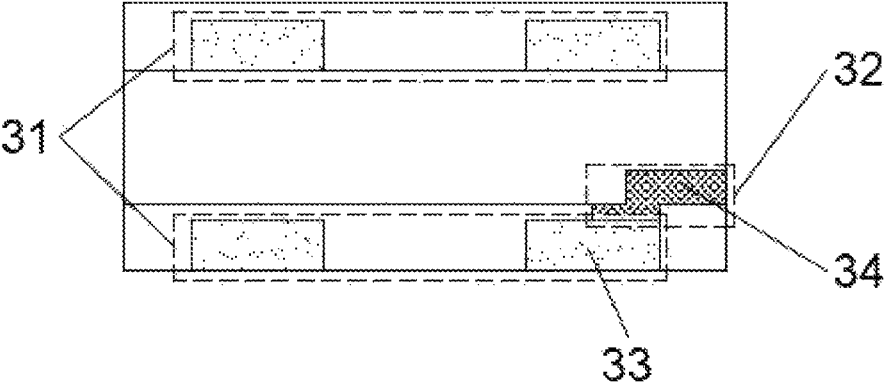
FIG. 2 is a schematic cross-sectional view of a signal area according to some embodiments of the present disclosure.

As shown in FIG. 2, FIG. 2 is a schematic cross-sectional view of a signal area according to some embodiments of the present disclosure. In some embodiments, in order to achieve narrow frames, the signal line area 30 includes a plurality of first metal layers 31 and at least one second metal layer 32. Two adjacent first metal layers 31 are at least provided with one second metal layer 32 therebetween. The signal lines include a plurality of first signal lines 33 and a plurality of second signal lines 34. The first metal layer 31 is provided with the first signal lines 33 and the second metal layer 32 is provided with the second signal lines 34. The first signal lines 33 are connected to the second signal lines 34 in an adjacent second metal layer 32 and the second signal lines 34 are connected to the gate driving circuit. The first signal lines 33 are for accessing the driving signals and the second signal lines 34 are for transmitting the driving signals to the gate driving circuit.

It should be noted that, in order to avoid short circuit between the metal layers, the two adjacent layers except for the connection therebetween are provided with insulating materials. The first metal layer 31 and the second metal layer 32 may be made of metal materials such as copper or tin. Though the specific widths of the first signal lines 33 and the second signal lines 34 also affect the width of the frame, the embodiment considers that the width of the frame can be further reduced when the specific width is determined.

Figure 3:
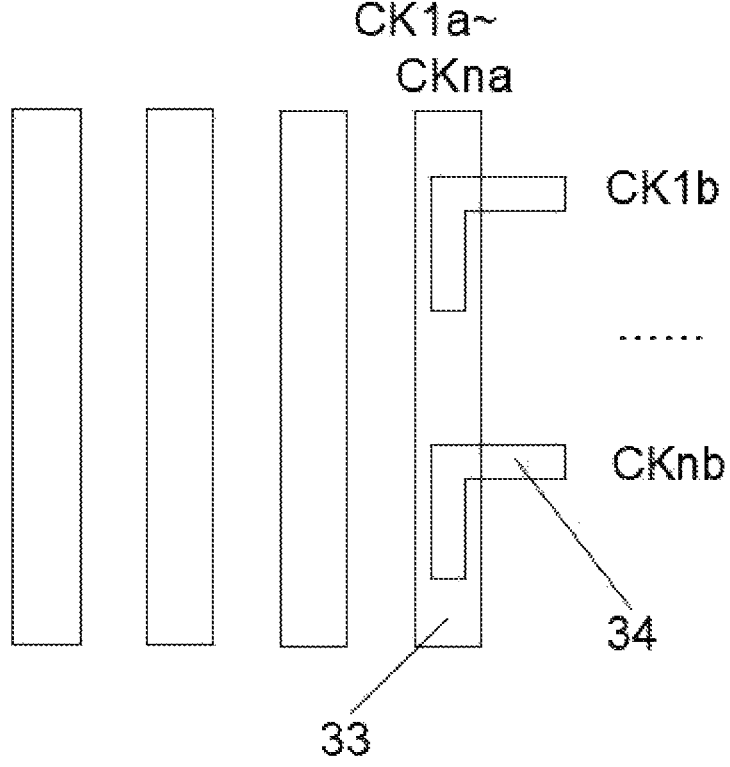
FIG. 3 is a schematic plan view of the signal area according to some embodiments of the present disclosure.

As shown in FIG. 3, FIG. 3 is a schematic structural view of the signal area according to some embodiments of the present disclosure. It should be noted that, since the gate driving circuit is usually arranged on both sides of the array substrate 80 and the control board is usually arranged above or below, thus each signal line usually includes a vertical segment and a horizontal segment. One end of the vertical segment is connected to the control board, the other end of the vertical segment is connected to one end of the horizontal segment, and the other end of the horizontal segment is connected to the gate driving circuit. In the embodiment, the first signal lines 33 are provided vertically and the second signal lines 34 are provided horizontally. A complete signal line is formed by a first signal line 33 and the corresponding second signal line 34. FIG. 3 takes the CK signal line as an example, the CK1*a* and CK1*b* form a complete CK1 signal line, which is used to transmit the clock signal transmitted by the control board to the gate driving circuit. Therefore, the number of the first signal lines 33 and the number of the second signal lines 34 are the same. Taking the CK signal lines as an example, if the number of the CK signal lines is 8, the number of the first signal lines 33 is 8, and the number of the second signal lines 34 is also 8.

It should be noted that since the width of the frame is mainly affected by the arrangement of the first signal lines 33, the horizontal width of the first signal lines 33 can be reduced by overlapping the first signal lines 33 in space. In addition, as the number of overlapping layers increases, the horizontal width of the first signal lines 33 becomes narrower. For example, if the number of signal lines is 8, the total width after all horizontal arrangement of 8 signal lines is 1.4 mm; if the 8 signal lines are distributed in two layers, the total width after arrangement is 0.7 mm; if the 8 signal lines are distributed in four layers, then the total width after arrangement is 0.35 mm.

If the second signal lines 34 is vertically arranged, the arrangement of the second signal lines 34 has little influence on the width of the frame. Thus the second metal layer 32 may or may not overlap. However, in order to ensure that the first signal line 33 in each first metal layer 31 can be connected to the corresponding second signal line 34, it is necessary to ensure that there is at least one second metal layer 32 between two adjacent first metal layers 31. That is, the number of the second metal layer 32 is greater than or equal to the number of the first metal layers 31 minus one.

In some embodiments, the array substrate 80 includes a display area 10, a gate driving circuit area 20 and a signal line area 30. The signal line area 30 includes a plurality of first metal layers 31 and at least one second metal layer 32. Two adjacent first metal layers 31 are at least provided with one second metal layer 32 therebetween. The signal lines include a plurality of first signal lines 33 and a plurality of second signal lines 34. The first metal layer 31 is provided with the first signal lines 33 and the second metal layer 32 is provided with the second signal lines 34. The first signal lines 33 are connected to the second signal lines 34 in an adjacent second metal layer 32 and the second signal lines 34 are connected to the gate driving circuit. In some embodiments, the horizontal width is reduced by overlapping the signal lines in space, to reduce the width of the frame of the panel.

Figure 4:
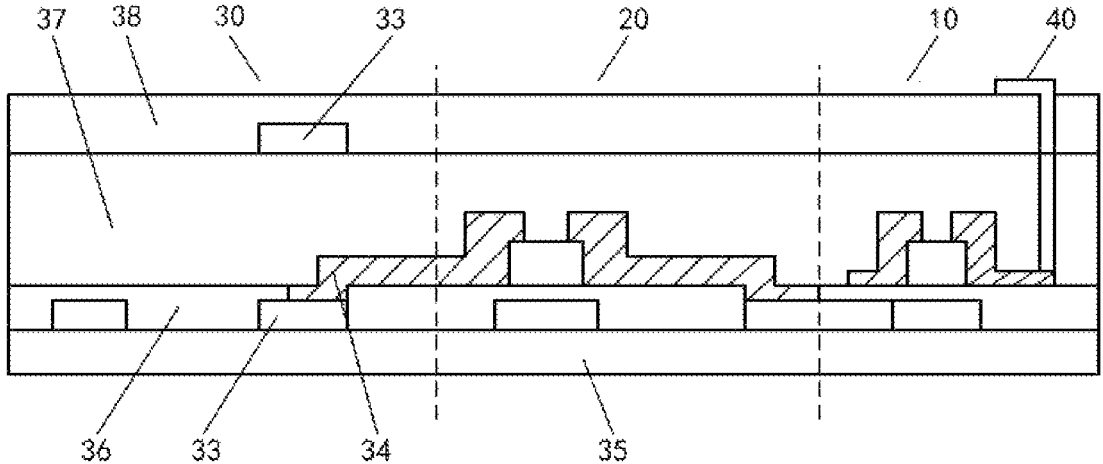
FIG. 4 is a schematic cross-sectional view of the signal area according to some embodiments of the present disclosure.

As shown in FIG. 4, FIG. 4 is a schematic cross-sectional view of a signal area according to some embodiments of the present disclosure.

In some embodiments, the signal line area 30 further includes a base 35 and a first insulating layer 36. One of the first metal layers 31 and the first insulating layer 36 are provided on the base 35, the first metal layer 31 is covered by the first insulating layer 36, and the second metal layer 32 is provided on the first insulating layer 36. The first insulating layer 36 is defined with a first hole. The first signal lines 33 on the first metal layer 31 on the base 35 are connected to the second signal lines 34 on the second metal layer 32.

It can be understood that, in the manufacturing process of the array substrate 80, the display area 10, the gate driving circuit area 20 and the signal line area 30 are usually formed at the same time. The first metal layer 31 and the metal wirings in the display area 10 and the gate driving circuit area 20 may be formed in the same process. Thus, in order to ensure the stability of the metal layer, the first insulating layer 36 needs to be covered on the first metal layer 31 and the metal wirings in the display area 10 and the gate driving circuit area 20. Sequentially, the second metal layer 32 and the metal wirings in the display area 10 and the gate driving circuit area 20 are simultaneously formed on the first insulating layer 36.

It should be noted that, in order to make the connection between the first signal line 33 and the second signal line 34 more stable, a plurality of the first holes (DC Hole in the figure) at the connection between the first signal line 33 and the second signal line 34 can be set, such as three or four.

Figure 5:
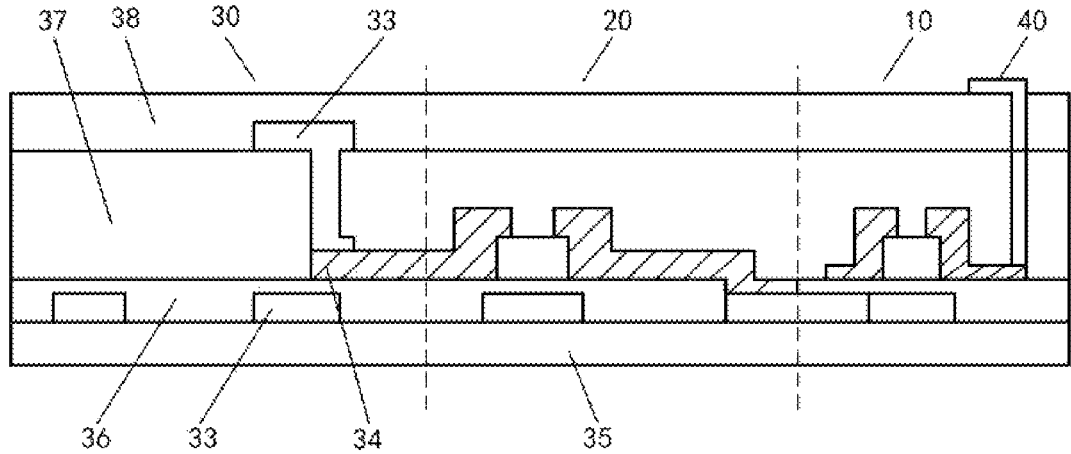
FIG. 5 is a schematic cross-sectional view of the signal area according to some embodiments of the present disclosure.

As shown in FIG. 5, FIG. 5 is a schematic cross-sectional view of a signal area according to some embodiments of the present disclosure. In some embodiments, the signal line area 30 further includes a passive layer 37 and a second insulating layer 38. The second insulating layer 38 is covered by the passive layer 37. Another of the first metal layers 31 is provided on the passive layer 37, the second insulating layer 38 is provided on the another of the first metal layers 31 on the passive layer 37. The passive layer 37 is defined with a second hole. The first signal lines 33 on the another of the first metal layers 31 on the passive layer 37 are connected to the second signal lines 34 on the second metal layer 32.

In order to ensure the stability of the second metal layer 32 and the metal wirings in the display area 10 and the gate driving circuit area 20, the second metal layer 32 and the metal wirings in the display area 10 and the gate driving circuit area 20 may be covered by the passive layer 37. Another of the first metal layers 31 is further disposed on the passive layer 37 and is covered by the second insulting layer 38. The second insulating layer 38 and the passive layer 37 of the display area 10 may be etched to form holes, and then the pixel electrode 40 can be deposited on the holes.

It should be noted that, in order to improve the production efficiency of the array substrate 80 and save the process, two first metal layers 31 can be set, and one second metal layer 32 can be set. Taking the CK signal lines as an example, if the number of CK signal lines is 8, the first signal lines 33 of the lower first metal layer may include CK1a, CK3a, CK5a and CK7a, and the first signal lines 33 of the upper first metal layer 31 may include CK2a, CK4a, CK6a, and CK8a. The second signal lines 34 of the second metal layer 32 may include CK1b, CK2b, CK3b, CK4b, CK5b, CK6b, CK7b, and CK8b. The CK2a can be located directly above CK1a; CK4a can be located directly above CK3a; CK6a can be located directly above CK5a; and CK8a can be located directly above CK7a. CK1b, CK2b, CK3b, CK4b, CK5b, CK6b, CK7b and CK8b can be arranged vertically and connected to corresponding CKa respectively.

It should be noted that, considering the coupling capacitance caused by the overlapping of the CK signal lines, the upper and lower CK lines may be partially overlap or totally overlap. For example, CK2a may be located above CK1a, and the projections of the two partially overlap in vertical direction, or CK2a may be located above a spacer area between CK1a and CK3a.

In some embodiments, two the first metal layers 31 and one second metal layer 32 can be set, to improve the production efficiency of the array substrate 80 and save the manufacturing process.

Figure 6:
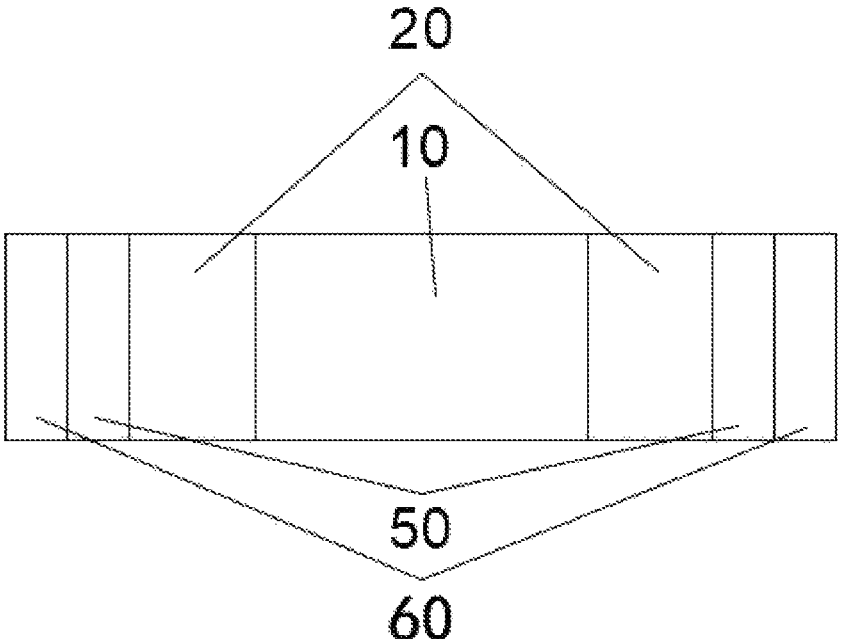
FIG. 6 is a schematic structural view of the array substrate according to some embodiments of the present disclosure.

As shown in FIG. 6, FIG. 6 is a schematic structural view of an array substrate 80 according to some embodiments of the present disclosure.

In some embodiments, the signal line area 30 includes a clock signal line area 50 and a common signal line area 60. The clock signal line area 50 is provided at an inner side of the common signal line area 60. Each first signal line 33 includes a clock signal line 311 and a common signal line 312. The clock signal line 311 is provided in the clock signal line area 50, and a projection of at least one clock signal line 311 partially overlaps with a projection of the other clock signal lines 311 in a vertical direction.

In order to minimize the width of the frame, the clock signal lines 311 may partially overlap or completely overlap with the projections of other clock signal lines 311 in the vertical direction. Due to the influence of the number of signal lines and the number of overlapping layers, some clock signal lines 311 may not overlap with other clock signal lines 311. For example, if there are two overlapping layers of CK signal lines, and there are 9 CK signal lines, then 5 CK signal lines can be set in one layer, and 4 CK signal lines can be set in the other layer. If two (upper and lower) CK signal lines are completely overlapped, there will be one signal line that cannot be overlapped.

In some embodiments, at least one clock signal line 311 is configured to be partially into the gate driving circuit area 20. Referring to the foregoing, CK2 and CK3 may be overlapped, CK4 and CK5 may be overlapped, CK6 and CK7 may be overlapped, CK8 and CK9 may be overlapped, and CK1 may not overlap with other clock signal line 311. CK1 may be the closest to the gate driving circuit area 20, and at this time, CK1 may be disposed at the bottom layer, and partially penetrate into the gate driving circuit area 20. Thus, the width of the frame can be further reduced by partial overlapping of the gate driving circuit area 20 with the gate driving circuit area 20.

In addition, at least one clock signal line 311 is configured to be partially into the common signal line area 60. Referring to the foregoing, CK1 and CK2 may be overlapped, CK3 and CK4 may be overlapped, CK5 and CK6 may be overlapped, CK7 and CK8 may be overlapped, and CK9 may not overlap with other clock signal line 311. The CK9 may be farthest from the gate driving circuit area 20, and at this time, the CK9 may be disposed on the top layer, and partially penetrate into the common signal line area 60. The common signal lines 312 are provided in the common signal line area 60, and the common signal lines 312 can directly extend into the display area 10, so the CK9 can overlap with the common signal line 312.

In addition, a clock signal line 311 farthest from the gate driving circuit area 20 is non-overlapping with other clock signal lines 311. A groove is provided in the clock signal area above the clock signal line 311 farthest from the gate driving circuit area 20, and is for being filled with a sealant. Referring to the foregoing, the clock signal line 311 farthest from the gate driving circuit area 20 may be the CK9 signal line. CK9 is at least partially located in the sealant area. Since there is no CK signal line on the upper layer, a groove can be provided, so that the groove can be used to increase the contact area between the sealant and the lower substrate, which is beneficial to the curing effect of the sealant.

In the embodiment, the signal line area 30 includes a clock signal line area 50 and a common signal line area 60. The clock signal line area 50 is provided at an inner side of the common signal line area 60. The first signal lines 33 includes clock signal lines 311 and common signal lines 312. The clock signal lines 311 are provided in the clock signal line area 50, and the projection of one clock signal line 311 partially overlaps with the projections of other clock signal lines 311 in the vertical direction, to further reduce the width of the frame.

Figure 7:
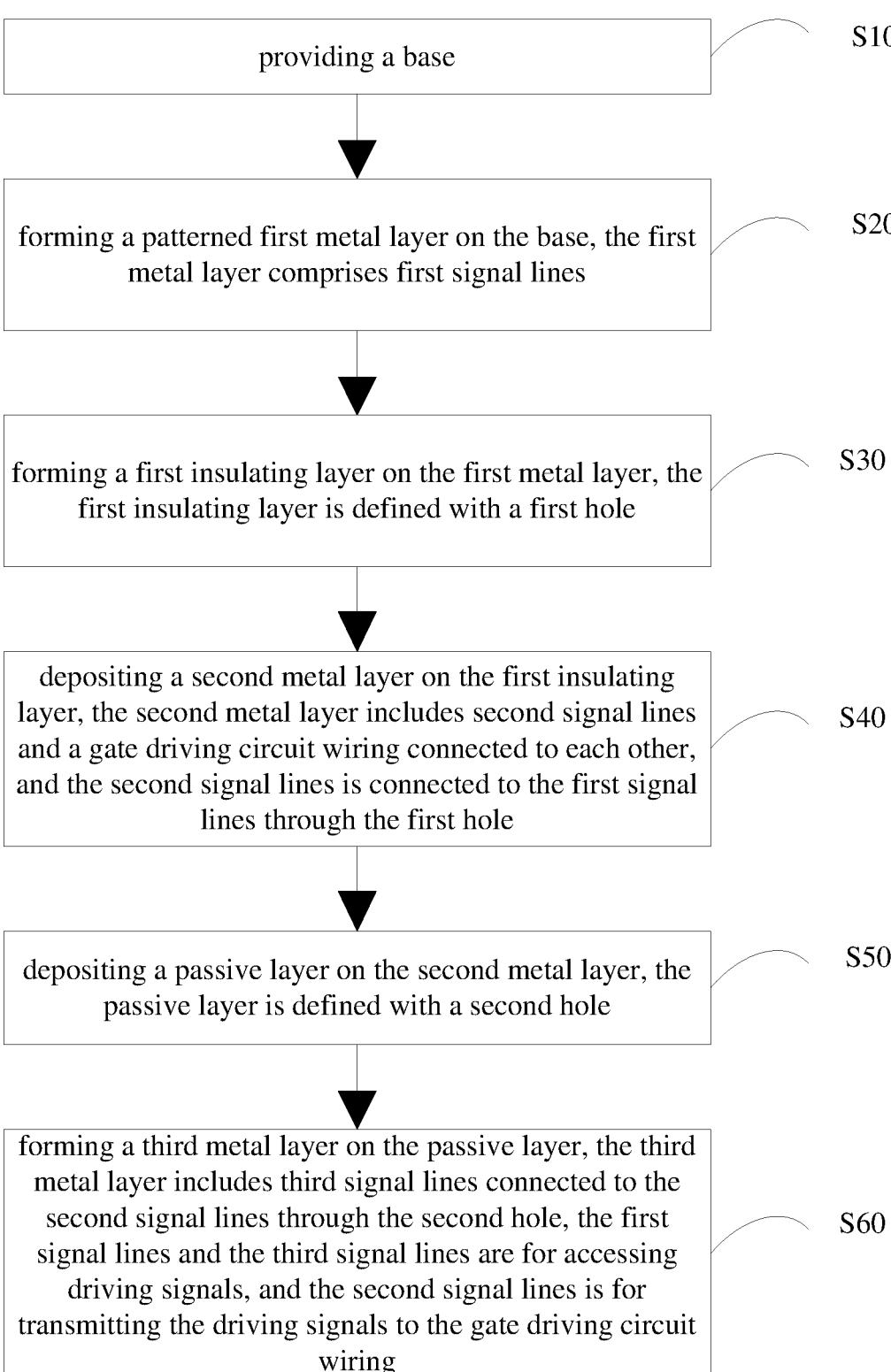
FIG. 7 is a flowchart of a method for manufacturing an array substrate according to some embodiments of the present disclosure.

As shown in FIG. 7, FIG. 7 is a schematic flowchart of a method for manufacturing an array substrate 80 according to some embodiments of the present disclosure.

In some embodiments, the method for manufacturing an array substrate 80 includes the following operations.

S10: providing a base 35.

It should be noted that the specific structure of the array substrate 80 may continue to refer to FIG. 4 and FIG. 5. The substrate can be divided into a display area 10, a gate driving circuit area 20 and a signal line area 30. In the subsequent steps, the wirings in the display area 10, the gate driving circuit area 20 and the signal line area 30 can be arranged at the same time.

S20: forming a patterned first metal layer 31 on the base 35, The first metal layer 31 includes first signal lines 33.

In some embodiments, the first metal layer 31 includes the wirings in the display area 10, the gate driving circuit area 20 and the signal line area 30. The first signal line 33 is the wiring in the signal line area 30, and the wirings in the display area 10 and the gate driving circuit area 20 are mainly used to form the gate of the TFT. The formation process of the first metal layer 31 may adopt processes such as deposition, exposure, development, and other related processes with mature technologies, which will not be repeated in this embodiment.

S30: forming a first insulating layer 36 on the first metal layer 31, the first insulating layer 36 is defined with a first hole;

On the first metal layer 31, the first insulating layer 36 can be formed by physical vapor deposition, and the first insulating layer 36 can be made of SiNx/SiOx. The first holes are mainly formed in the signal line area 30 and the display area 10. The first holes in the signal line area 30 are convenient for connecting signal lines of different layers, and the first holes in the display area 10 are convenient for the connection of the wirings in the gate driving circuit area 20 with the wirings in the display area 10.

S40: depositing a second metal layer 32 on the first insulating layer 36, the second metal layer 32 includes second signal lines 34 and a gate driving circuit wiring connected to each other, and the second signal lines 34 is connected to the first signal lines 33 through the first hole.

In the embodiment, the second metal layer 32 also includes the wirings in display area 10, the gate driving circuit area 20 and in the signal line area 30. The second signal lines 34 are located in the signal line area 30, and the width in the gate driving circuit is located in the gate driving circuit area 20. The second signal lines 34 are connected to the first signal lines 33 to transmit the driving signals to the gate driving circuit. The wiring in the second metal layer 32 in the gate driving circuit area 20 and the signal line area 30 is mainly used to form the source electrode or the drain electrode of the TFT. The wiring especially the gate output signal line, in the gate driving circuit area 20 can also be connected to the gate of the TFT in the display area 10 through the first hole.

S50: depositing a passive layer 37 on the second metal layer 32, the passive layer 37 is defined with a second hole;

It is understandable that the passive layer 37 can be used to protect the metal wiring. The second hole is mainly located in the signal line area 30 to facilitate the connection of the second signal lines 34 and the first signal lines 33.

S60: forming a third metal layer on the passive layer 37, the third metal layer comprises third signal lines connected to the second signal lines 34 through the second hole. The first signal lines 33 and the third signal lines are for accessing driving signals, and the second signal lines 34 is for transmitting the driving signals to the gate driving circuit wiring.

It should be noted that the third metal layer is mainly concentrated in the signal line area 30. The number of the second signal lines 34 is equal to a sum of the third signal lines and the first signal lines 33. For example, if the signal lines include 8 CK signal lines, the first signal line 33 may include CK1*a*, CK3*a*, CK5*a*, and CK7*a*, and the third signal line may include CK2*a*, CK4*a*, CK6*a*, and CK8*a*. The second signal lines 34 include CK1*b*, CK2*b*, CK3*b*, CK4*b*, CK5*b*, CK6*b*, CK7*b*, and CK8*b*. CKa and corresponding CKb form a complete CK signal line. The projections of the third signal line and the first signal line 33 in the vertical direction may completely or partially overlap, or the third signal line may be located just above the spacer area between the first signal lines 33.

In addition, in order to protect the third metal layer, a planarization layer is provided on the third metal layer, and then a hole is defined on the planarization layer in a display area 10 to deposit a pixel electrode 40 in the hole. The pixel electrode 40 is connected to the source electrode or drain electrode of the TFT in the display area 10.

In some embodiments, as shown in S10 to S60, providing a base 35; forming a patterned first metal layer on the base, the first metal layer includes first signal lines; forming a first insulating layer on the first metal layer, the first insulating layer is defined with a first hole; depositing a second metal layer on the first insulating layer, the second metal layer includes second signal lines and a gate driving circuit wiring connected to each other, and the second signal lines is connected to the first signal lines through the first hole; depositing a passive layer on the second metal layer, the passive layer is defined with a second hole; forming a third metal layer on the passive layer, the third metal layer comprises third signal lines connected to the second signal lines through the second hole; the first signal lines and the third signal lines are for accessing driving signals, and the second signal lines is for transmitting the driving signals to the gate driving circuit wiring. Due to the overlapping of the signal lines, the wiring width of the signal line area 30 is reduced, which is beneficial to reduce the wiring width of the display panel 100.

Figure 8:
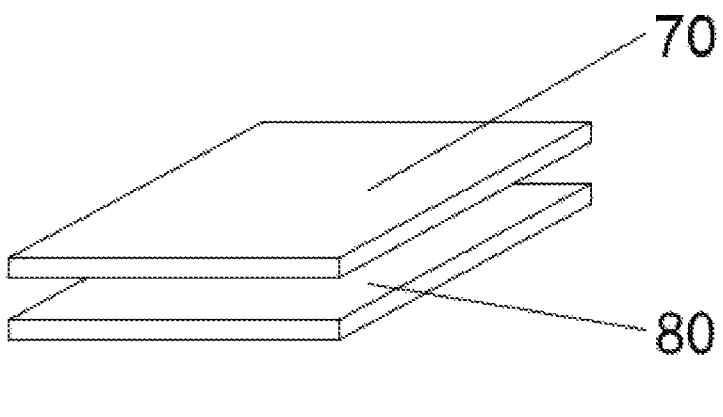
FIG. 8 is a schematic structural view of a display panel according to some embodiments of the present disclosure.
Figure 9:
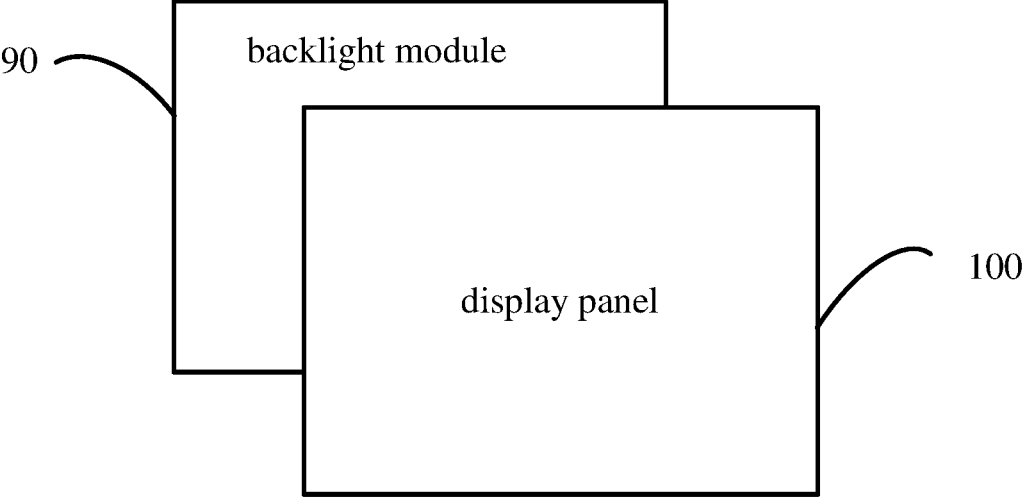
FIG. 9 is a schematic structural view of a display device according to some embodiments of the present disclosure.

As shown in FIG. 8, FIG. 8 is a schematic structural view of a display panel 100 according to some embodiments of the present disclosure.

In order to achieve the above objective, the present disclosure further provides a display panel 100. The display panel 100 includes a color filter 70 and an array substrate 80 aforementioned. The color filter 70 is configured aligned with the array substrate 80. The specific structure of the array substrate 80 refers to the above-mentioned embodiments. Since the display panel 100 can adopt the technical solutions of all the above-mentioned embodiments, it has at least the beneficial effects brought by the technical solutions of the above-mentioned embodiments, and will not be repeated here.

In order to achieve the above objective, the present disclosure further provides a display device. The display device includes a backlight module 90 and a display panel 100 aforementioned. The backlight module 90 and the display panel 100 are configured corresponding to each other, and the backlight module 90 is for providing a backlight source for the display panel 100. The specific structure of the array substrate 80 refers to the above-mentioned embodiments. Since the display device can adopt the technical solutions of all the above-mentioned embodiments, it has at least the beneficial effects brought by the technical solutions of the above-mentioned embodiments, and will not be repeated here.

The above are only some embodiments of the present disclosure, and do not limit the scope of the present disclosure thereto. Under the concept of the present disclosure, equivalent structural transformations made according to the description and drawings of the present disclosure, or direct/ indirect application in other related technical fields are included in the scope of the present disclosure.

What is claimed is:

1. An array substrate, comprising:

a display area provided with a plurality of pixels;

a gate driving circuit area provided with a gate driving circuit for driving the pixels; and a signal line area provided with a plurality of signal lines for providing driving signals for the gate driving circuit;

wherein, the signal line area comprises a plurality of first metal layers and at least one second metal layer, and two adjacent first metal layers are at least provided with one second metal layer therebetween;

the signal lines comprise a plurality of first signal lines and a plurality of second signal lines, the first metal layer is provided with the first signal lines and the second metal layer is provided with the second signal lines, the first signal lines are connected to the second signal lines in an adjacent second metal layer and the second signal lines are connected to the gate driving circuit;

each first signal line is formed only in the first metal layer and not in the second metal layer, and each second signal line is formed only in the second metal layer and not in the first metal layer;

the first signal lines are provided in the first metal layers and extend in a vertical direction;

the second signal lines are provided in the second metal layer and extend in a horizontal direction;

each of the first signal lines has one end connected to a control board and another end connected to one end of a corresponding second signal line in the adjacent second metal layer;

each complete signal path is composed of the first signal line and the corresponding second signal line connected only through the first hole defined in the first insulating layer;

another end of the second signal line is connected to the gate driving circuit, such that the first signal lines are configured to access the driving signals, and the second signal lines are configured to transmit the driving signals to the gate driving circuit; and an arrangement of the plurality of first metal layers and at least one second metal layer, in which at least one second metal layer is provided between any two adjacent first metal layers, is configured to form orthogonal signal paths between the first and second signal lines so as to reduce wiring density and lateral occupation;

wherein the signal line area further comprises a base and a first insulating layer;

one of the first metal layers and the first insulating layer are provided on the base, the first metal layer is covered by the first insulating layer, and the second metal layer is provided on the first insulating layer;

the first insulating layer is defined with a first hole; and first signal lines on the first metal layer on the base are connected to the second signal lines on the second metal layer.

2. The array substrate of claim 1, wherein the display area further comprises a data line, a scan line and a thin film transistor (TFT);

the data line is connected to a source electrode or a drain electrode of the TFT;

the scan line is connected to a gate electrode of the TFT, and the drain electrode or the source electrode of the TFT is connected to a pixel electrode of each pixel.

3. The array substrate of claim 2, wherein the gate driving circuit is for outputting a gate control voltage to turn on or turn off the TFT.

4. The array substrate of claim 1, wherein the first signal lines are provided vertically and the second signal lines are provided horizontally.

5. The array substrate of claim 1, wherein the signal line area further comprises a passive layer and a second insulating layer;

the second insulating layer is covered by the passive layer;

another of the first metal layers is provided on the passive layer, the second insulating layer is provided on the another of the first metal layers on the passive layer;

the passive layer is defined with a second hole; and the first signal lines on the another of the first metal layers on the passive layer are connected to the second signal lines on the second metal layer.

6. The array substrate of claim 1, wherein the signal line area comprises a clock signal line area and a common signal line area;

the clock signal line area is provided at an inner side of the common signal line area;

each first signal line comprises a clock signal line and a common signal line, the clock signal line is provided in the clock signal line area, and a projection of at least one clock signal line partially overlaps with a projection of the other clock signal lines in a vertical direction.

7. The array substrate of claim 6, wherein at least one the clock signal line is configured to be partially into the gate driving circuit area.

8. The array substrate of claim 2, wherein at least one the clock signal line is configured to be partially into the common signal line area.

9. A display device, comprising:

a backlight module; and a display panel, comprising:

a color filter; and an array substrate, comprising:

a display area provided with a plurality of pixels;

a gate driving circuit area provided with a gate driving circuit for driving the pixels;

a signal line area provided with a plurality of signal lines for providing driving signals for the gate driving circuit;

wherein, the signal line area comprises first metal layers of a plurality of layers and a second metal layer of at least one layer, the first metal layers of two adjacent layers are at least provided with one second metal layer;

the signal lines comprise a plurality of first signal lines and a plurality of second signal lines, the first metal layer is provided with the first signal lines and the second metal layer is provided with the second signal lines, the first signal lines are connected to the second signal lines in an adjacent second metal layer and the second signal lines are connected to the gate driving circuit;

each first signal line is formed only in the first metal layer and not in the second metal layer, and each second signal line is formed only in the second metal layer and not in the first metal layer;

the first signal lines are provided in the first metal layers and extend in a vertical direction;

the second signal lines are provided in the second metal layer and extend in a horizontal direction;

each of the first signal lines has one end connected to a control board and another end connected to one end of a corresponding second signal line in the adjacent second metal layer;

each complete signal path is composed of the first signal line and the corresponding second signal line connected only through the first hole defined in the first insulating layer;

another end of the second signal line is connected to the gate driving circuit, such that the first signal lines are configured to access the driving signals, and the second signal lines are configured to transmit the driving signals to the gate driving circuit; and an arrangement of the plurality of first metal layers and at least one second metal layer, in which at least one second metal layer is provided between any two adjacent first metal layers, is configured to form orthogonal signal paths between the first and second signal lines so as to reduce wiring density and lateral occupation;

wherein the signal line area further comprises a base and a first insulating layer;

one of the first metal layers and the first insulating layer are provided on the base, the first metal layer is covered by the first insulating layer, and the second metal layer is provided on the first insulating layer;

the first insulating layer is defined with a first hole;

first signal lines on the first metal layer on the base are connected to the second signal lines on the second metal layer;

the color filter is configured to be aligned with the array substrate; and the backlight module and the display panel are configured corresponding to each other, and the backlight module is for providing a backlight source for the display panel.

\*   \*   \*   \*   \*